United States Patent
Cha et al.

(10) Patent No.: US 8,823,433 B2
(45) Date of Patent: Sep. 2, 2014

(54) DATA OUTPUT CIRCUIT

(71) Applicant: SK hynix Inc., Icheon-si (KR)

(72) Inventors: Jin Youp Cha, Icheon-si (KR); Jin Hee Cho, Icheon-si (KR); Jae Il Kim, Icheon-si (KR)

(73) Assignee: SK Hynix Inc., Gyeonggi-do (KR)

(*) Notice: Subject to any disclaimer, the term of this patent is extended or adjusted under 35 U.S.C. 154(b) by 0 days.

(21) Appl. No.: 13/846,547

(22) Filed: Mar. 18, 2013

(65) Prior Publication Data
US 2014/0184286 A1 Jul. 3, 2014

(30) Foreign Application Priority Data

Jan. 3, 2013 (KR) ........................ 10-2013-0000721

(51) Int. Cl.
*H03K 7/08* (2006.01)
*H03K 3/011* (2006.01)

(52) U.S. Cl.
CPC ..................................... *H03K 3/011* (2013.01)
USPC ......................................................... 327/175

(58) Field of Classification Search
CPC ...... H03K 5/017; H03K 5/156; H03K 5/1565
See application file for complete search history.

(56) References Cited

U.S. PATENT DOCUMENTS

| 6,373,309 | B1 * | 4/2002 | Bang .............................. 327/175 |
| 7,199,634 | B2 * | 4/2007 | Cho et al. ...................... 327/175 |
| 7,423,465 | B2 * | 9/2008 | Gomm .......................... 327/175 |
| 7,676,686 | B2 * | 3/2010 | Ku et al. ....................... 713/600 |
| 7,724,052 | B2 * | 5/2010 | Hur ............................... 327/158 |
| 7,737,745 | B2 * | 6/2010 | You ............................... 327/158 |
| 7,777,542 | B2 * | 8/2010 | Ku ................................. 327/158 |
| 7,800,423 | B2 * | 9/2010 | Kim et al. ..................... 327/175 |
| 7,863,957 | B2 * | 1/2011 | Jang et al. ..................... 327/175 |
| 7,911,251 | B2 * | 3/2011 | Lee et al. ...................... 327/291 |
| 8,018,261 | B2 * | 9/2011 | Becker et al. ................. 327/175 |
| 8,036,062 | B2 | 10/2011 | Kim et al. |
| 2009/0146700 | A1 * | 6/2009 | Kim et al. ..................... 327/144 |
| 2013/0114352 | A1 * | 5/2013 | Kim ......................... 365/189.05 |

FOREIGN PATENT DOCUMENTS

KR 100813554 B1 3/2008

* cited by examiner

*Primary Examiner* — Thomas J Hiltunen
(74) *Attorney, Agent, or Firm* — William Park & Associates Ltd.

(57) ABSTRACT

A data output circuit according to one embodiment of the present invention includes: a delay control block configured to generate a clock delay signal in response to a power-up signal and a reset signal; a first delay block configured to correct a duty ratio of a rising clock according to the clock delay signal and output the corrected rising clock; and a second delay block configured to correct a duty ratio of a falling clock according to the clock delay signal and output the corrected falling clock.

14 Claims, 4 Drawing Sheets

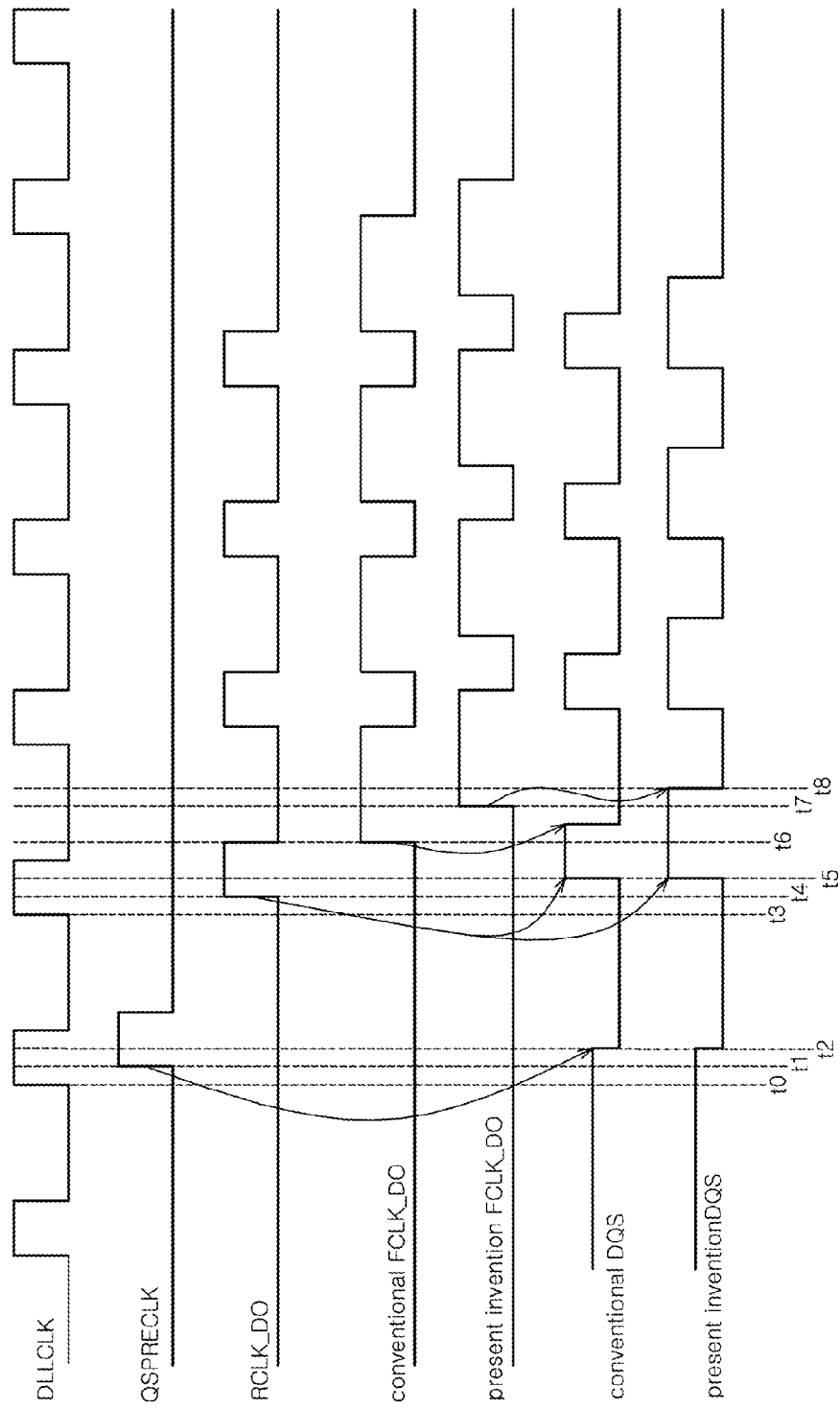

DATA OUTPUT CIRCUIT

CROSS-REFERENCES TO RELATED APPLICATION

The present application claims priority under 35 U.S.C. §119(a) to Korean application number 10-2013-0000721 filed on Jan. 3, 2013, in the Korean Intellectual Property Office, which is incorporated herein by reference in its entirety.

BACKGROUND

1. Technical Field

Various embodiments generally relate to a data output circuit, and more particularly to a data output circuit for generating a data output clock to improve a data window width.

2. Related Art

Double data rate (DDR) synchronous memory apparatuses are configured to transfer data on both the rising and falling edges of a clock signal.

For example, when a synchronous DRAM (SDRAM) communicates with a memory controller, the SDRAM transmit and receive data through data pins (e.g., DQ). When data is read from the SDRAM through the data pins, the memory controller reads data using a data strobe signal (e.g., DQS). When the memory controller writes to the SDRAM, data pins have the data to be written according to the data strobe signal.

A DDR SDRAM outputs data to an external device such as the memory controller in synchronization with the rising edge or falling edge of the data strobe signal. Also, data are written to the DDR SDRAM in synchronization with the data strobe signal.

Therefore, the slew rate and the duty cycle of the data strobe signal are supposed to be controlled to meet a requirement of DDR SDRAM standards.

However, when a skew difference occurs in rising clocks and falling clocks, which are required for generation of a data strobe signal, due to PVT variation or a difference in the characteristics of the PMOS and NMOS of a transistor, the duty ratio of the data strobe signal may be distorted.

It is very important to accurately control the duty ratio of a clock in a semiconductor memory device. When the duty ratio of a clock is not controlled, a narrow pulse width of an output signal reduces a timing margin. In a high-speed operation, this may cause incorrect data to be received.

SUMMARY

A circuit for providing a data output clock to improve a data window width is described herein.

In an embodiment of the present invention, a data output circuit includes: a delay control block configured to generate a clock delay signal in response to a power-up signal and a reset signal; a first delay block configured to correct a duty ratio of a rising clock according to control of the clock delay signal, and to output the corrected rising clock; and a second delay block configured to correct a duty ratio of a falling clock according to control of the clock delay signal, and to output the corrected falling clock.

In an embodiment of the present invention, a data output circuit includes: a delay control block configured to generate a clock delay signal which is a digital signal in response to a power-up signal and a reset signal; a first delay block configured to control a degree of delay of an input rising clock in response to the clock delay signal, and to output a corrected rising clock; a second delay block configured to control a degree of delay of an input falling clock in response to the clock delay signal, and to output a corrected falling clock; a first driver configured to drive the corrected rising clock, and to supply a rising data clock; a second driver configured to drive the corrected falling clock, and to supply a falling data clock; and first and second trigger units configured to trigger rising data and falling data in response to the rising data clock and the falling data clock, and thus to supply a data output clock.

According to the present invention, it is possible to monitor a skew difference due to PVT variation, and to control delays of a rising data clock and a falling data clock in application of the skew difference. Since the delays of the clocks are controlled, the duty ratio of a data output clock can be improved. Accordingly, the valid window of data can be stably ensured.

BRIEF DESCRIPTION OF THE DRAWINGS

Features, aspects, and embodiments are described in conjunction with the attached drawings, in which:

FIG. 5 is a timing diagram illustrating waveforms of data output clocks according to an embodiment of the present invention.

DETAILED DESCRIPTION

Hereinafter, a data output circuit according to an embodiment of the present invention will be described below with reference to the accompanying drawings.

Figure 1:
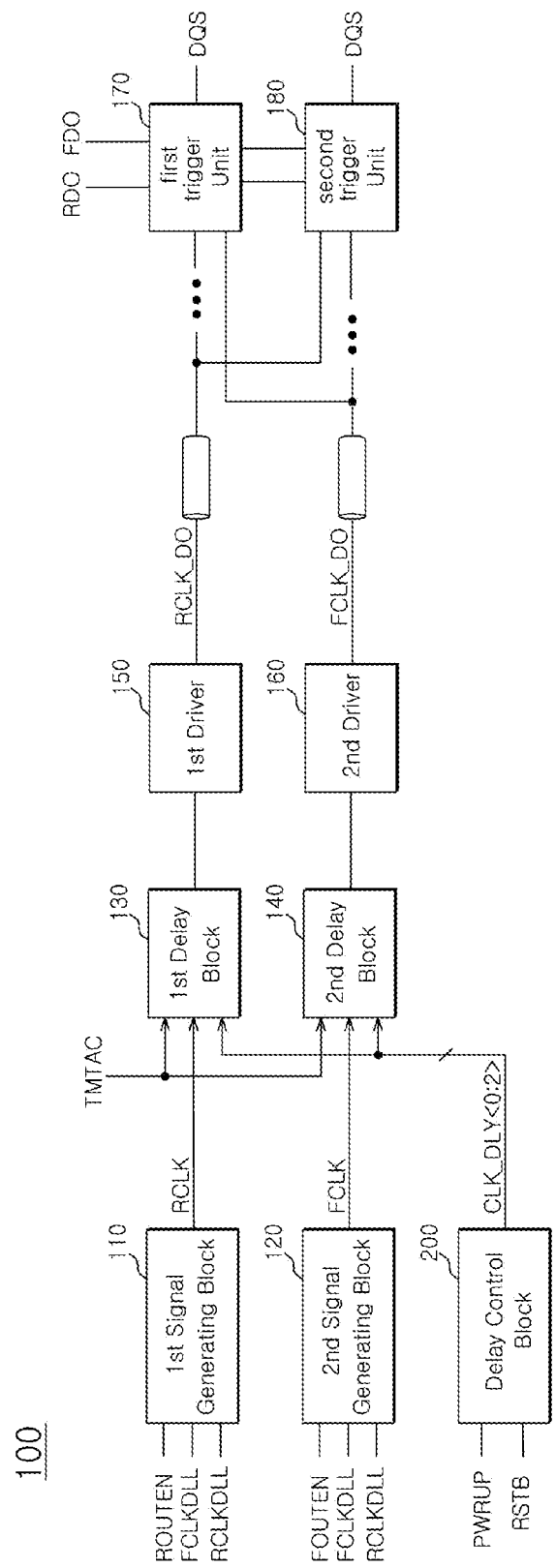
FIG. 1 is a block diagram showing a data output circuit according to an embodiment of the present invention.

FIG. 1 is a block diagram illustrating the configuration of a data output circuit 100 according to an embodiment of the present invention.

Referring to FIG. 1, a data output circuit 100 includes a first signal generating block 110, a first delay block 130, a first driver 150, a second signal generating block 120, a second delay block 140, a second driver 160, a first trigger unit 170, a second trigger unit 180, and a delay control block 200.

The first signal generating block 110 receives a rising DLL clock RCLKDLL and a falling DLL clock FCLKDLL and generates a rising clock RCLK in response to a first output control signal ROUTEN.

The first delay block 130 is activated by a delay block activation signal TMTAC, and delays the rising clock RCLK by a predetermined time period according to a clock delay signal CLK_DLY <0:2>.

The first driver 150 drives an output signal of the first delay block 130 to generate a rising data clock RCLK_DO.

The second signal generating block 120 receives a rising DLL clock RCLKDLL and a falling DLL clock FCLKDLL and generates a falling clock FCLK in response to a second output control signal FOUTEN.

The second delay block 140 is activated by a delay block activation signal TMTAC, and delays the falling clock FCLK by a predetermined time period according to a clock delay signal CLK_DLY <0:2>.

The delay block activation signal TMTAC may be regarded as an enable signal of a normal delay block.

The second driver 160 drives an output signal of the second delay block 140 to generate a falling data clock FCLK_DO.

The generated rising data clock RCLK_DO and falling data clock FCLK_DO pass through predetermined repeaters respectively. The first and second trigger units 170 and 180 trigger rising data RDO and falling data FDO in response to the rising data clock RCLK_DO and falling data clock FCLK_DO and output data output clocks DQSs.

The first signal generating block 110 generates a rising clock RCLK in response to a first output control signal ROUTEN, which is a control signal for a rising clock having information on Column Address Strobe Latency (CL) and Burst Length (BL). Similarly, the second signal generating block 120 generates a falling clock FCLK in response to a second output control signal FOUTEN, which is a control signal for a falling clock having information on CL and BL.

Accordingly, the first delay block 130 and second delay block 140 can control the amount of delay of the rising clock RCLK and falling clock FCLK according to a plurality of control signals, e.g., three clock delay signal CLK_DLY <0:2> according to an embodiment of the present invention.

In an embodiment of the present invention, the duty ratios of the rising clock RCLK and the falling clock FCLK are controlled according to the numbers of high signals and low signals, respectively, included in a clock delay signal CLK_DLY <0:2>.

For example, the numbers of turned-on PMOSs and NMOSs in the first delay block 130 and second delay block 140 may be determined according to the number of high signals included in a clock delay signal CLK_DLY <0:2>. Accordingly, the "high" period of the rising clock RCLK or the "high" period of the falling clock FCLK are controlled, and the duty ratios of the rising clock RCLK and falling clock FCLK may be improved.

In an embodiment of the present invention, the data output circuit 100 includes the delay control block 200 so as to supply a clock delay signal CLK_DLY <0:2>, in which the process characteristics of PMOS and NMOS transistors are reflected, in response to a power-up signal PWRUP and a reset signal RSTB. A detailed description thereof will be given later with reference to FIG. 2.

The first driver 150 and second driver 160 drive a rising clock and a falling clock whose duty ratios have been corrected to generate a rising data clock RCLK_DO and a falling data clock FCLK_DO.

As described above, the generated rising data clock RCLK_DO and falling data clock FCLK_DO pass through predetermined repeaters respectively. The first and second trigger units 170 and 180 trigger rising data RDO and falling data FDO in response to the rising data clock RCLK_DO and falling data clock FCLK_DO and output data output clocks DQSs.

As described above, according to an embodiment of the present invention, a skew difference or a difference in the transistor characteristics between PMOS and NMOS transistors is monitored, and a clock delay signal CLK_DLY <0:2> in which a result of the monitoring is reflected is generated so as to further improve the duty ratios of the rising clock RCLK and falling clock FCLK. Accordingly, the duty ratios are improved and corrected to stably ensure the data valid window width of a data output clock DQS, which is a final output clock so as to implement a high-efficiency circuit and reduce errors in the operation of a semiconductor memory device.

Figure 2:
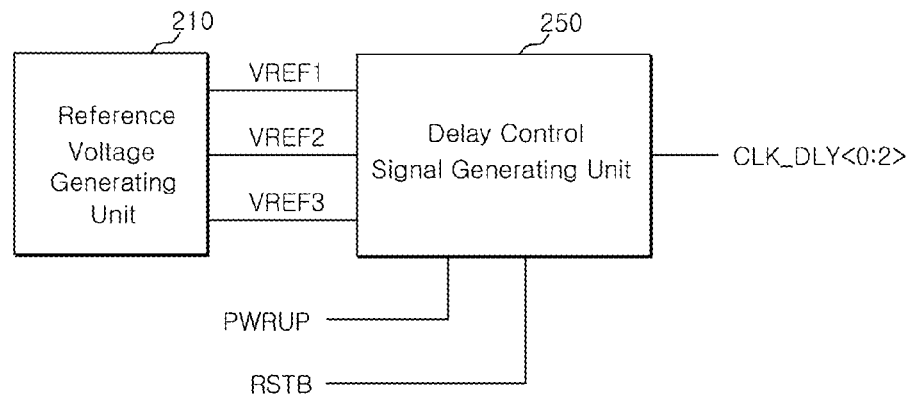
FIG. 2 is a block diagram illustrating a delay control block capable of being implemented in the block diagram of FIG. 1.

FIG. 2 is a block diagram illustrating a delay control block capable of being implemented in the block diagram of FIG. 1.

Referring to FIG. 2, the delay control block 200 includes a reference voltage generating unit 210 and a delay control signal generating unit 250.

The reference voltage generating unit 210 generates three types of reference voltages VREF1, VREF2, and VREF3 from a constant current source.

The delay control signal generating unit 250 generates a clock delay signal CLK_DLY <0:2> using the first to third reference voltages VREF1, VREF2, and VREF3, in response to the power-up signal PWRUP and the reset signal RSTB.

A more detailed description thereof will be given with reference to FIGS. 3 and 4.

Figure 3:
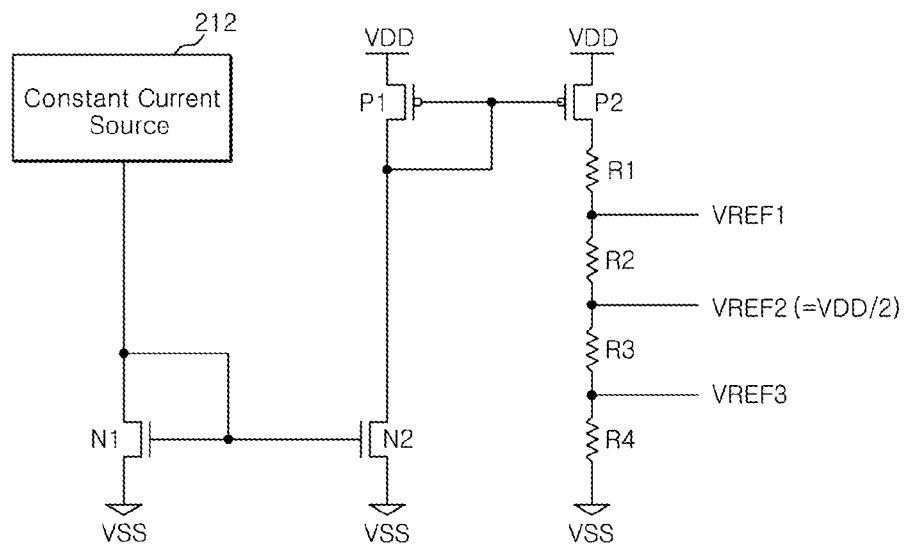
FIG. 3 is a circuit diagram illustrating a reference voltage generating unit capable of being implemented in the block diagram of FIG. 2.

FIG. 3 is a circuit diagram illustrating the reference voltage generating unit 210 capable of being implemented in the block diagram of FIG. 2.

The reference voltage generating unit 210 includes a constant current source 212, a first NMOS transistor N1, a second NMOS transistor N2, a first PMOS transistor P1, and a second PMOS transistor P2.

The constant current source 212 includes a normal current source which supplies constant current at all times.

The first and second NMOS transistors N1 and N2, for example, may form a current mirror structure.

In an embodiment of the present invention, the gate and the source of the first NMOS transistor N1 are coupled to each other, and the gate of the first NMOS transistor N1 and the gate of the second NMOS transistor N2 are coupled to each other.

The first and second PMOS transistors P1 and P2, for example, may form a current mirror structure.

In an embodiment of the present invention, the gate and the drain of the first PMOS transistor P1 are coupled to each other, and the gate of the first PMOS transistor P1 and the gate of the second PMOS transistor P2 are coupled to each other.

In the reference voltage generating unit 210, current supplied from the constant current source 212 passes through the first and second NMOS transistors N1 and N2 and the first and second PMOS transistors P1 and P2. When current flows through first to fourth resistors R1 to R4, voltage is divided so that a first reference voltage VREF1, a second reference voltage VREF2, and a third reference voltage VREF3 are generated.

In the reference voltage generating unit 210, current supplied from the constant current source 212, i.e., current flowing through the first NMOS transistor N1 is copied so that the same amount of current flows through the second NMOS transistor N2. Also, current flowing through the second NMOS transistor N2, i.e., current flowing through the first PMOS transistor P1 is copied so that the same amount of current flows through the second PMOS transistor P2.

Here, the second reference voltage VREF2 is set to a ½ VDD level. Therefore, the first reference voltage VREF1 is higher by a predetermined level than the ½ VDD level, and the third reference voltage VREF3 is lower by a predetermined level than the ½ VDD level.

In addition, the reference voltage generating unit 210 may be configured with various types of reference voltage generators. For example, a band gap reference voltage generator may be used. Any voltage generator which can generate a plurality of reference voltages may be used.

Here, the generated first reference voltage VREF1, second reference voltage VREF2, and third reference voltage VREF3 are used as references for detecting a skew of the PMOS and NMOS transistors in a following circuit unit.

Figure 4:
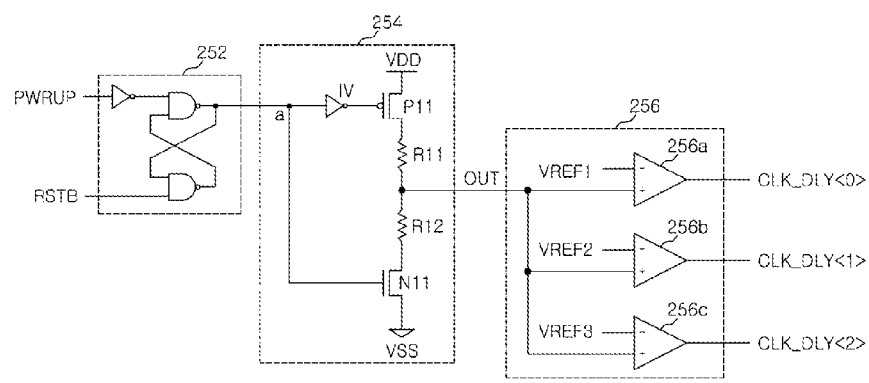
FIG. 4 is a circuit diagram illustrating a delay control signal generating unit capable of being implemented in the block diagram of FIG. 2.

FIG. 4 is a detailed circuit diagram illustrating the delay control signal generating unit 250 capable of being implemented in the block diagram of FIG. 2.

Referring to FIG. 4, the delay control signal generating unit 250 includes a latch section 252, a monitoring section 254, and a comparison section 256.

First, the latch section 252 applies a signal to node "a" in response to the power-up signal PWRUP and the reset signal RSTB.

The latch section 252 is an SR latch circuit configured with NAND gates. Accordingly, the latch section 252 can supply a high level signal to node "a" in response to a high-level power-up signal PWRUP. The latch section 252 can maintain node "a" at a high level until a low-level reset signal RSTB is inputted and the power-up signal PWRUP becomes a low level.

The monitoring section 254 includes an inverter IV, a first PMOS transistor P11, a first NMOS transistor N11, a first resistor R11, and a second resistor R12.

The monitoring section 254 can monitor skew of the first PMOS transistor P11 and first NMOS transistor N11 when a level of node "a" is inverted.

When the first PMOS transistor P11 and first NMOS transistor N11 are turned on, the voltage of the output node OUT of the monitoring section 254 can be determined.

In a normal state, identically, the first PMOS transistor P11 and first NMOS transistor N11 have the same on-resistance and are turned on at the same time, and thus the voltage of the output node OUT can have a ½ VDD level.

However, when a change in the process causes skew of a PMOS transistor or an NMOS transistor, the on-resistance which the first PMOS transistor P11 and first NMOS transistor N11 have may vary.

For example, when node "a" is at a high level, the first PMOS transistor P11 and the first NMOS transistor N11 are turned on. In connection with the voltage applied at the output node OUT via the first and second resistors R11 and R12, when the PMOS transistor is a "fast" transistor and the NMOS transistor is a "slow" transistor, the on-resistance of the first PMOS transistor P11 may be smaller than the on-resistance of the first NMOS transistor N11 so that the voltage of output node "a" becomes higher by a predetermined level than the ½ VDD level.

In contrast, when the NMOS transistor is a "fast" transistor and the PMOS transistor is a "slow" transistor, the on-resistance of the first PMOS transistor P11 may be larger than the on-resistance of the first NMOS transistor N11, so that the voltage of output node "a" becomes lower than the ½ VDD level.

As described above, according to an embodiment of the present invention, it is possible to detect a process corner condition and to monitor occurrence of skew using the PMOS transistor and NMOS transistor.

Subsequently, the comparison section 256 will be explained. The comparison section 256 receives the voltage of the output node OUT, and generates a clock delay signal CLK_DLY <0:2> by comparing the received voltage with the first to third reference voltages VREF1, VREF2, and VREF3.

The comparison section 256 includes a first comparator 246a, a second comparator 246b, and a third comparator 246c.

The first comparator 256a compares the voltage of the output node OUT with the first reference voltage VREF1. The second comparator 256b compares the voltage of the output node OUT with the second reference voltage VREF2. The third comparator 256c compares the voltage of the output node OUT with the third reference voltage VREF3.

Each of the first to third comparators 256a, 256b, and 256c provide the respective comparison results as a high level or a low level.

For example, when the voltage of the output node OUT is higher than the first reference voltage VREF1, the output value of the first comparator 256a becomes a high level.

When the voltage of the output node OUT is higher than the first reference voltage VREF1, as described above, each output value of the second comparator 246b and third comparator 246c will be a high level.

According to such a result, the comparison section 256 can reflect a skew difference of a transistor depending on a process change in a clock delay signal CLK_DLY <0:2>.

When a more precise delay control is necessary, a plurality of delay control signals may be generated.

Referring again to FIG. 1, it is possible to control the delays of the rising clock RCLK and falling clock FCLK of the first delay block 130 and second delay block 140 in response to such a clock delay signal CLK_DLY <0:2>, so that the rising edge timings of the rising data clock RCLK_DO and falling data clock FCLK_DO can be controlled. Finally, the duty ratio of the data output clock DQS is determined by an interval between the rising edges of the rising data clock RCLK_DO and falling data clock FCLK_DO, thereby being able to ensure the data valid window width of the DQS.

FIG. 5 is a timing diagram illustrating waveforms of data output clocks according to an embodiment of the present invention.

In FIG. 5, a DQS enable signal QSPRECLK, which is not explained, can be regarded as a signal which enables the output of a DQS.

The period of time t0 to t1 is a period in which the DQS enable signal QSPRECLK is activated to enable the output of a DQS.

The DQS is enabled in a period of time t1 to t2 in response to the DQS enable signal QSPRECLK.

At time t4, the rising data clock RCLK_DO is activated, and the rising edge of the data output clock DQS is activated in response to the rising data clock RCLK_DO.

In a known art, since a falling data clock FCLK_DO has the opposite level of the rising data clock RCLK_DO, the rising edge of the falling data clock FCLK_DO is activated at time t6, and the duty ratio of a data output clock DQS is determined by these data clocks, so that the data output clock DQS having a very narrow data valid window width is generated.

In contrast, according to an embodiment of the present invention, for example, it can be understood that: the delay of a falling data clock FCLK_DO is controlled to activate a rising edge thereof at time t7; a data valid window width is activated for a period of time t5 to t8 by an interval between the rising edges of a rising data clock RCLK_DO and the falling data clock FCLK_DO, the delays of which are controlled by reflecting skew; and thus a data output clock DQS having a significantly improved data valid window width is generated.

As described above, according to an embodiment of the present invention, a skew difference of a transistor due to PVT variation is monitored, and the delays of a rising edge and a falling edge are controlled by reflecting the monitored skew difference, so that it is possible to generate a more stable data output clock.

While certain embodiments have been described above, it will be understood to those skilled in the art that the embodiments described are by way of example only. Accordingly, the circuit described herein should not be limited based on the described embodiments. Rather, the circuit described herein should only be limited in light of the claims that follow when taken in conjunction with the above description and accompanying drawings.

What is claimed is:

1. A data output circuit comprising:
a delay control block configured to generate a clock delay signal in response to a power-up signal and a reset signal;
a first delay block configured to correct a duty ratio of a rising clock according to the clock delay signal and output the corrected rising clock; and
a second delay block configured to correct a duty ratio of a falling clock according to the clock delay signal and output the corrected falling clock
wherein the delay control block includes a monitoring section configured to monitor skew of a PMOS transistor and an NMOS transistor of the delay control block.

2. The data output circuit according to claim 1, wherein the delay control block comprises:
a reference voltage generating unit configured to generate a plurality of reference voltages by using a constant current source; and
a delay control signal generating unit configured to generate the clock delay signal in response to the plurality of reference voltages.

3. The data output circuit according to claim 2, wherein the delay control signal generating unit comprises:
a latch section configured to output a first voltage in response to the power-up signal and the reset signal; and
a comparison section configured to compare a result obtained by the monitoring section with the plurality of reference voltages and output the clock delay signal,
wherein the monitoring section is configured to monitor in response to the first voltage.

4. The data output circuit according to claim 3, wherein the monitoring section comprises:
a PMOS transistor configured to be activated in response to the first voltage; and
an NMOS transistor coupled to the PMOS transistor, and configured to be activated in response to the first voltage.

5. The data output circuit according to claim 4, wherein the monitoring section monitors a change in the voltage of an output node, depending on an on-resistance difference of the PMOS transistor and the NMOS transistor according to first voltage.

6. A data output circuit comprising:
a delay control block configured to generate a clock delay signal which is a digital signal in response to a power-up signal and a reset signal;
a first delay block configured to control a delay of an input rising clock in response to the clock delay signal and output a corrected rising clock;
a second delay block configured to control a delay of an input falling clock in response to the clock delay signal and output a corrected falling clock;
a first driver configured to drive the corrected rising clock and output a rising data clock;
a second driver configured to drive the corrected falling clock and output a falling data clock; and
first and second trigger units configured to trigger rising data and falling data in response to the rising data clock and the falling data clock and generate a data output clock,
wherein a duty ratio of the data output clock is determined by an interval between rising edges of the corrected rising clock and the corrected falling clock and controlled according to a bit value of the clock delay signal.

7. The data output circuit according to claim 6, wherein the delay control block comprises:
a reference voltage generating unit configured to generate a plurality of reference voltages having constant voltage levels; and
a delay control signal generating unit configured to generate the clock delay signal of plural bits in response to the plurality of reference voltages.

8. The data output circuit according to claim 7, wherein the delay control signal generating unit comprises:
a latch section configured to output a first voltage in response to the power-up signal and the reset signal;
a monitoring section configured to monitor skew of a PMOS transistor and an NMOS transistor in response to the first voltage; and
a comparison section configured to compare a result obtained by the monitoring section with each of the plurality of reference voltages and output the clock delay signal of plural bits.

9. The data output circuit according to claim 8, wherein the monitoring section comprises:
a PMOS transistor configured to be activated in response to the first voltage; and
an NMOS transistor coupled to the PMOS transistor, and configured to be activated in response to the first voltage.

10. The data output circuit according to claim 9, wherein the monitoring section monitors a change in the voltage of an output node, depending on an on-resistance difference of the PMOS transistor and the NMOS transistor according to the first voltage.

11. A data output circuit comprising:
a reference voltage generating unit configured to generate a plurality of reference voltages;
a delay control signal generating unit configured to generate a clock delay signal in response to the plurality of reference voltages, a power-up signal and a reset signal;
a delay block configured to correct a duty ratio of a rising clock and a duty ratio of a falling clock according to the clock delay signal; and
a trigger unit configured to generate a data output clock in response to the rising clock and the falling clock.

12. The data output circuit according to claim 11, wherein the delay control signal generating unit comprises:
a latch section configured to output a first voltage in response to the power-up signal and the reset signal;
a monitoring section configured to monitor skew of a PMOS transistor and an NMOS transistor in response to the first voltage; and
a comparison section configured to compare a result obtained by the monitoring section with the plurality of reference voltages and output the clock delay signal.

13. The data output circuit according to claim 12, wherein the monitoring section comprises:
a PMOS transistor configured to be activated in response to the first voltage; and
an NMOS transistor coupled to the PMOS transistor, and configured to be activated in response to the first voltage.

14. The data output circuit according to claim 13, wherein the monitoring section monitors a change in the voltage of an output node, depending on an on-resistance difference of the PMOS transistor and the NMOS transistor according to the first voltage.

* * * * *